(12) United States Patent
Muto et al.

(10) Patent No.: US 8,835,883 B2
(45) Date of Patent: Sep. 16, 2014

(54) CHARGED PARTICLE RADIATION DEVICE AND SOUNDPROOF COVER

(75) Inventors: Daisuke Muto, Hitachinaka (JP); Masanori Watanabe, Hitachinaka (JP); Hiroshi Tsuji, Hitachinaka (JP); Masaru Matsushima, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/703,926

(22) PCT Filed: Jun. 3, 2011

(86) PCT No.: PCT/JP2011/003137
§ 371 (c)(1),
(2), (4) Date: Dec. 13, 2012

(87) PCT Pub. No.: WO2011/158458
PCT Pub. Date: Dec. 22, 2011

(65) Prior Publication Data
US 2013/0082194 A1    Apr. 4, 2013

(30) Foreign Application Priority Data
Jun. 16, 2010    (JP) .................................. 2010-136716

(51) Int. Cl.
*G10K 11/16* (2006.01)
*G21K 5/00* (2006.01)
*H01J 37/28* (2006.01)

(52) U.S. Cl.
CPC .................. *G10K 11/16* (2013.01); *H01J 37/28* (2013.01); *H01J 2237/0216* (2013.01); *G21K 5/00* (2013.01)
USPC .......................... 250/492.3; 181/200; 181/290

(58) Field of Classification Search
CPC .................................. G10K 11/16; G21K 5/00
USPC ..................... 250/492.3, 522.1; 181/200, 290
See application file for complete search history.

(56) References Cited

U.S. PATENT DOCUMENTS 3,819,007 A * 6/1974 Wirt et al. ..................... 181/286
6,002,987 A * 12/1999 Kamiya et al. ............. 250/492.2
(Continued)

FOREIGN PATENT DOCUMENTS

| JP | 11-210109 | 8/1999 |
| JP | 3661779 | 4/2005 |

(Continued)

*Primary Examiner* — Michael Logie
*Assistant Examiner* — Wyatt Stoffa
(74) *Attorney, Agent, or Firm* — Antonelli, Terry, Stout & Kraus, LLP.

(57) ABSTRACT

A charged particle radiation device includes a sample chamber in which a sample stage adapted to mount a sample is installed, a charged particle radiation irradiation section adapted to irradiate the sample with a charged particle radiation to observe and fabricate the sample, sidewalls installed on a periphery of the sample chamber and the charged particle radiation irradiation section, a ceiling board installed on a plane located in an upper part of the sidewalls, and a sound absorbing structure section disposed below the ceiling board, and including a plurality of hole sections and a hollow section communicated with the hole sections. The sound absorbing structure section has an absorption band including a frequency band of a standing wave generated in a space surrounded by the sidewalls and the ceiling board. Further, a soundproof cover may include the sidewalls, ceiling board and sound absorbing structure.

10 Claims, 9 Drawing Sheets

(56) References Cited

U.S. PATENT DOCUMENTS

| | | |
|---|---|---|
| 2004/0191474 A1 | 9/2004 | Yamagiwa et al. |
| 2007/0189567 A1* | 8/2007 | Visscher et al. ............. 181/284 |
| 2008/0257542 A1* | 10/2008 | Brisco et al. ................. 166/207 |
| 2008/0257642 A1* | 10/2008 | Yamagiwa et al. ........... 181/292 |
| 2011/0266088 A1* | 11/2011 | Koike et al. .................. 181/290 |
| 2013/0118831 A1* | 5/2013 | Kawai et al. .................. 181/290 |

FOREIGN PATENT DOCUMENTS

| | | | |
|---|---|---|---|
| JP | 2006-79870 | | 3/2006 |
| JP | 2006079870 A | * | 3/2006 |
| JP | 2007-226216 | | 9/2007 |

* cited by examiner

CHARGED PARTICLE RADIATION DEVICE AND SOUNDPROOF COVER

TECHNICAL FIELD

The present invention relates to a soundproof cover for reducing sound and vibrations from external environment, and in particular to a cover for a device, which is used in, for example, a clean room, and is required to have a dust-proof property.

BACKGROUND ART

A soundproof cover is used for the purpose of cutting the transmission of noise. Typically, the soundproof cover is formed of a nonporous material to have a plate-like shape, and is installed at a position between a target noise reduction region and a sound source so as to be perpendicular to the arrival direction of the noise.

Since the noise has a property of propagating so as to wrap around an object, if a significant noise reduction effect is required, it is common to install the soundproof cover so as to surround the periphery of the noise reduction region, and typically, surfaces with a hexahedral structure having upper and lower, right and left, former and latter surfaces are formed in view of a construction property and cost reduction.

In the case in which the soundproof cover has a single layer, the noise reduction performance of the soundproof cover is basically proportional to the weight thereof, and increases 6 dB every time the weight doubles. In contrast, if a multilayer sandwich structure with an organic porous material sandwiched inside is adopted, it is possible to effectively improve the noise reduction performance with little weight. On the other hand, by adopting the multilayer structure, the installation space and the cost are increased. In general, in the field of acoustic engineering, there is known the fact that there exists a resonant frequency depending on the shape of a flask-shaped container due to the air vibration in the mouth portion of the shape of the container. This is called the Helmholtz resonance principle, and there is a technology of absorbing sound using this principle. For example, Patent Literature 1 discloses a porous soundproof structure for absorbing noise using the Helmholtz resonance principle.

Further, the soundproof cover is also required for a device used in a clean room. In a charged particle radiation device, for example, miniaturization of the pattern of the observation object or the test object has progressed in recent years, and high-magnification observation using electron beams or the like is performed. However, the wobble of an image occurs due to the minute sound pressure or vibration from the outside, and problems due to the vibration have become obvious with the increase in magnification. In such a case, if the soundproof cover using a fiber material such as glass wool or an organic porous material represented by a foam material such as urethane is adopted, a dusting property due to the droplets of the organic material hinders the dust-proof property of the clean room to cause a problem in some cases. Patent Literature 2 discloses a technology of covering the sound absorbing material with dust-proof fibers and then attaching it to an exterior cover.

CITATION LIST

Patent Literature

Patent Literature 1: Japanese Patent No. 3,661,779
Patent Literature 2: JP-A-2006-79870

SUMMARY OF THE INVENTION

Problems that the Invention is to Solve

As described above, in particular in the charged particle radiation device and so on, since observation or fabrication is performed with high accuracy, if a vibration due to the external sound is generated, a disorder occurs in some cases. Although such a device is generally used in a clean room, many of the conventional soundproof covers have a dusting property, and are not suitable for use in a clean room. Therefore, although the need for taking dust-proof measures on the dustproof cover arises, the material with a dusting property is also used in, for example, Patent Literature 2, and the dust-proof performance is still insufficient.

The present invention has an object of reducing the vibration disorder of a device used in a clean room by providing a soundproof cover with a high dust-proof property.

Means for Solving the Problem

A soundproof cover including sidewalls installed on a periphery of a device, on which one of sound insulation and vibration removal is intended to be performed, a ceiling board installed on a plane located in an upper part of the sidewalls, and a sound absorbing structure section disposed on a space side of the ceiling board, the space being intended to be insulated, and including a plurality of hole sections and a hollow section communicated with the hole sections is configured to thereby solve the problems described above.

Further, by using the soundproof cover described above as the exterior cover of the device, the problems described above can be solved.

Advantage of the Invention

According to the present invention, the vibration disorder of the device used in a clean room can be reduced.

MODE FOR CARRYING OUT THE INVENTION

Embodiments of the present invention will hereinafter be described with reference to the accompanying drawings.

Figure 1:
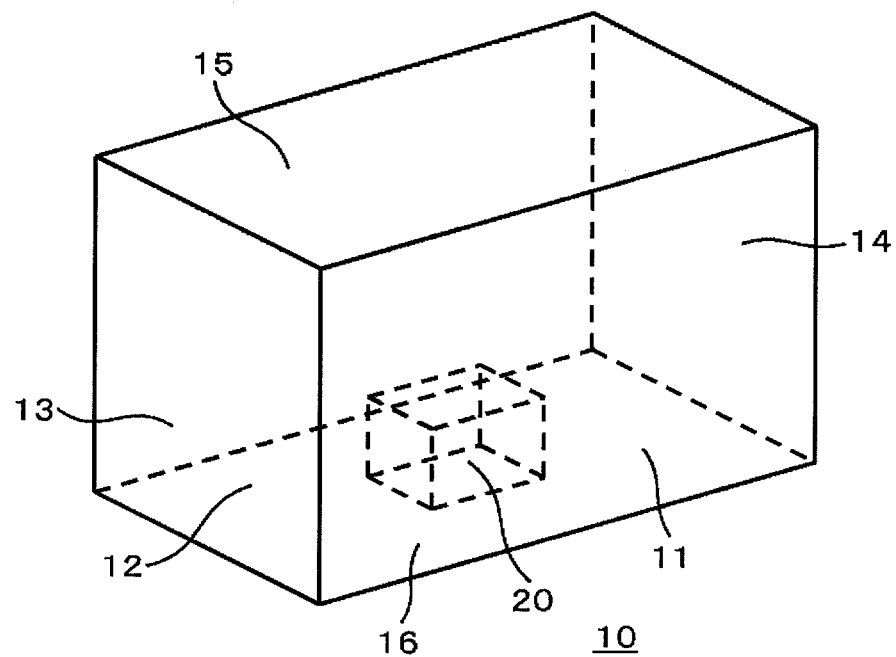
FIG. 1 is an overall view of a soundproof cover having a device inside.
Figure 2:
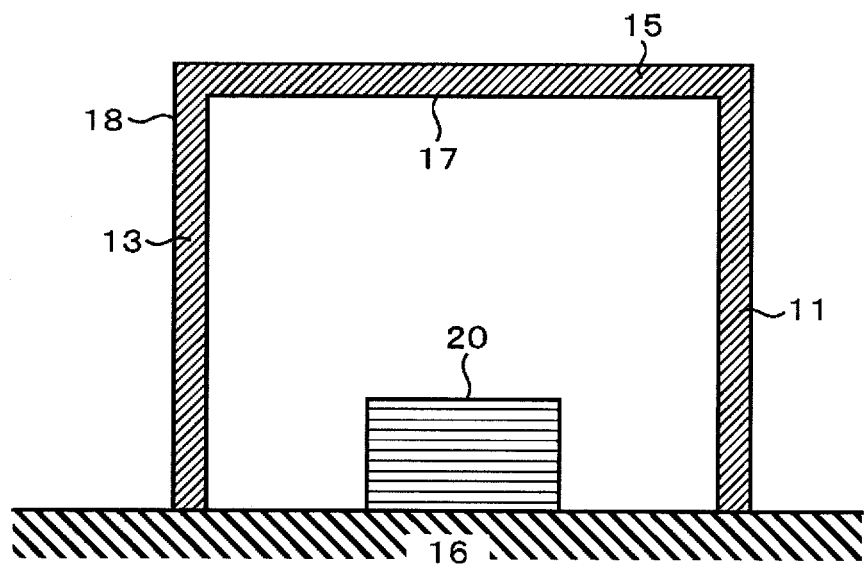
FIG. 2 is a cross-sectional view of FIG. 1.

A general outline of a soundproof cover, which is a distinguishing configuration of the invention of the present patent application, will be explained using FIGS. 1 and 2. FIG. 1 shows an overall view of the soundproof cover 10, and FIG. 2 shows a cross-sectional view of FIG. 1. The soundproof cover 10 is basically composed of four sides 11, 12, 13, and 14, a ceiling 15, and a floor face 16, and is installed so as to surround a device 20, which is a sound source, or which is attempted to be protected from the acoustic excitation. By installing it in such a manner as described above, it is possible to prevent the external sound from wrapping around the cover and entering the cover to thereby cause the vibration. It should be noted that the floor face 16 is not necessarily required, and it is also possible that the device 20 is directly installed on the floor with, for example, legs having vibration removing mechanism.

In the following explanation, in the side 13, the ceiling 15, and the floor face 16, the surface on the space side, the space being surrounded by the side and the ceiling, is referred to as an interior surface, and the surface on the outside is referred to as an exterior surface. The interior surface 17 and the exterior surface 18 can be two sides of each of the sidewalls and the ceiling board, or can be formed of members independent from each other.

Figure 3:
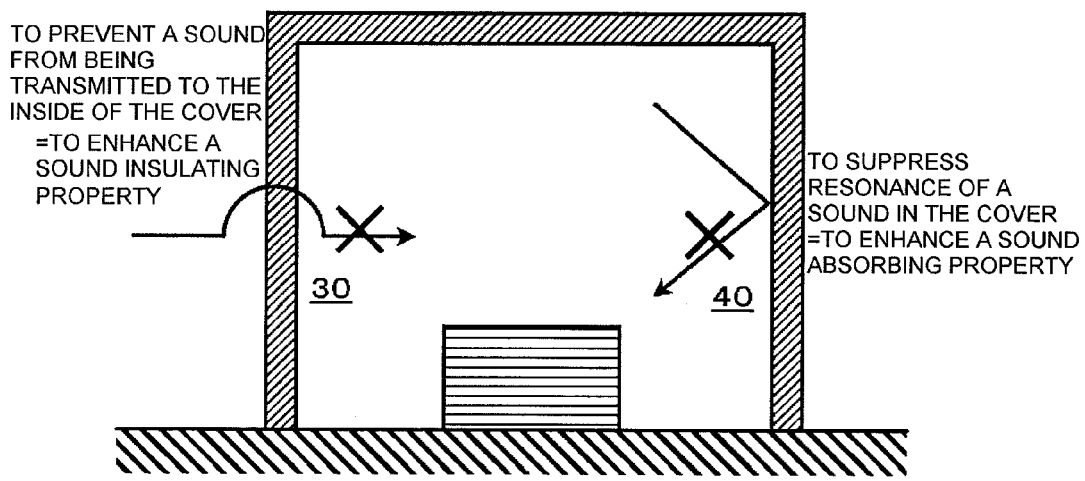
FIG. 3 is a diagram for explaining two measures for reducing the noise inside the cover.

The method in the case of considering the protection from the acoustic excitation with respect to the device 20 as a target will be explained using FIG. 3. FIG. 3 shows the necessary function for the cover structure aimed at the projection from the acoustic excitation with respect to the device 20, which is basically divided into two, namely (1) a function of preventing the sound from being transmitted to the inside of the cover, and (2) a function of suppressing the resonance of the sound in the cover, in order to improve the soundproof performance of the cover.

Figure 4:
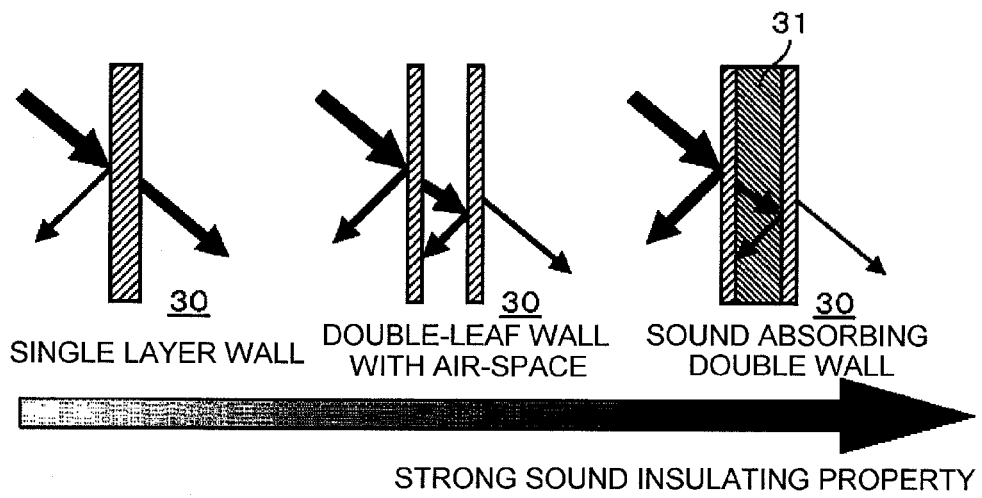
FIG. 4 is a diagram for explaining sound insulation out of the items shown in FIG. 3.

Among the above, (1) the function of preventing the noise from being transmitted to the inside of the cover is called a sound insulating property, and in order to enhance the sound insulating property, a sound insulating structure section 30 is applied to the cover. Specifically, for example, the cover, which would typically be formed of a single layer, is provided with a dual structure or a sandwich structure with an organic porous material 31 sandwiched therebetween as shown in FIG. 4.

Figure 5:
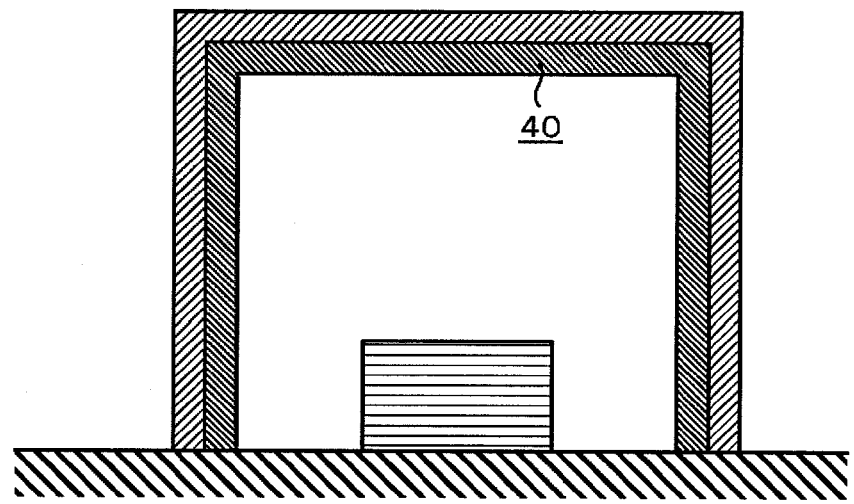
FIG. 5 is a diagram for explaining sound absorption out of the items shown in FIG. 3.

On the other hand, (2) the function of suppressing the resonance of the sound in the cover is called a sound absorbing property, and the cover is provided with a sound absorbing structure section 40 in order to enhance the performance. Specifically, it is common that the organic porous material 31 described above is disposed on the inside of the cover as shown in FIG. 5 to which no treatment would normally be provided.

Figure 6:
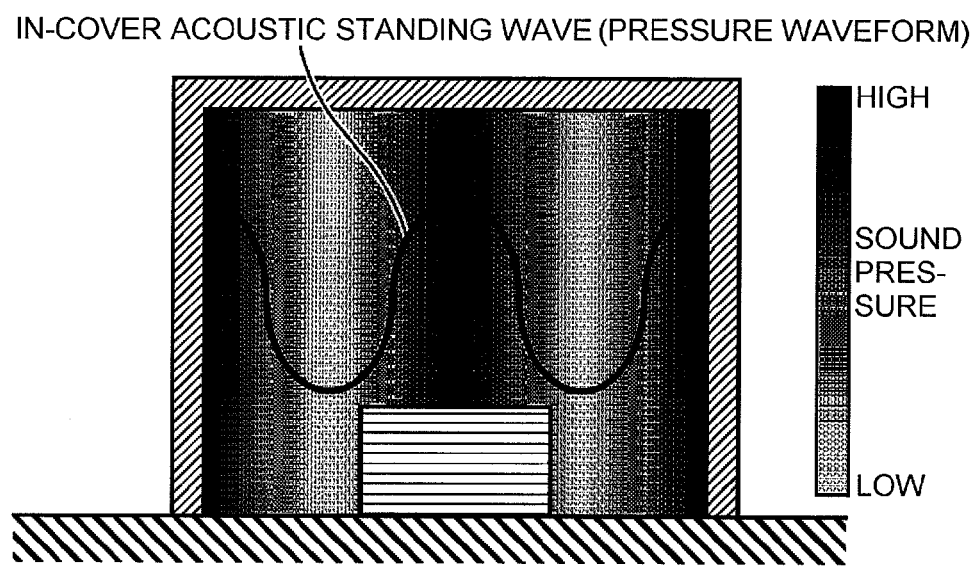
FIG. 6 is a diagram for explaining an acoustic standing wave generated in the cover.

Incidentally, in the inside of the cover, which forms an enclosed region closed with the cover in order to enhance the sound insulating property and the sound absorbing property, the acoustic standing wave with a frequency depending on the shape and the size of the internal space of the cover may sometimes be generated. FIG. 6 shows an example of the acoustic standing wave, and the progressive wave and the regressive wave propagate back and forth between a certain pair of surfaces parallel to each other out of the 6 surfaces of the cover, for example, form the standing wave shown in FIG. 6. Therefore, there arises a problem that the soundproof performance of the cover is extremely degraded at the frequency at which the acoustic standing wave is generated. Therefore, although in such a case the sound insulating structure section 30 and the sound absorbing structure section 40 exerting the effect at the frequency of the acoustic standing wave to be generated are required, it is difficult to bring out the performance specialized for a certain specific frequency in the case of applying the structures shown in FIGS. 4 and 5.

Further, in the case in which it is used in a device (e.g., a charged particle radiation device used for inspection, measurement, observation, fabrication, and so on of semiconductor components or liquid crystal substrates) used in an environment for which the dust-proof property is required such as a clean room, if the organic porous material 31 is used, the dusting property due to the droplets of the organic porous material 31 hinders the dust-proof property of the clean room to thereby cause a problem in some cases.

Some embodiments of the present invention for solving these problems will hereinafter be explained. The soundproof structure, which is a distinguishing configuration of the invention of the present patent application, will be explained in Embodiment 1 using FIGS. 7 and 8, and some modified examples of Embodiment 1 will be explained in Embodiment 2, Embodiment 3, Embodiment 4, and Embodiment 5. In Embodiment 6, an example of applying the soundproof structure according to the invention of the present patent application to a cover of a charged particle radiation device will be explained.

Embodiment 1

Figure 7:
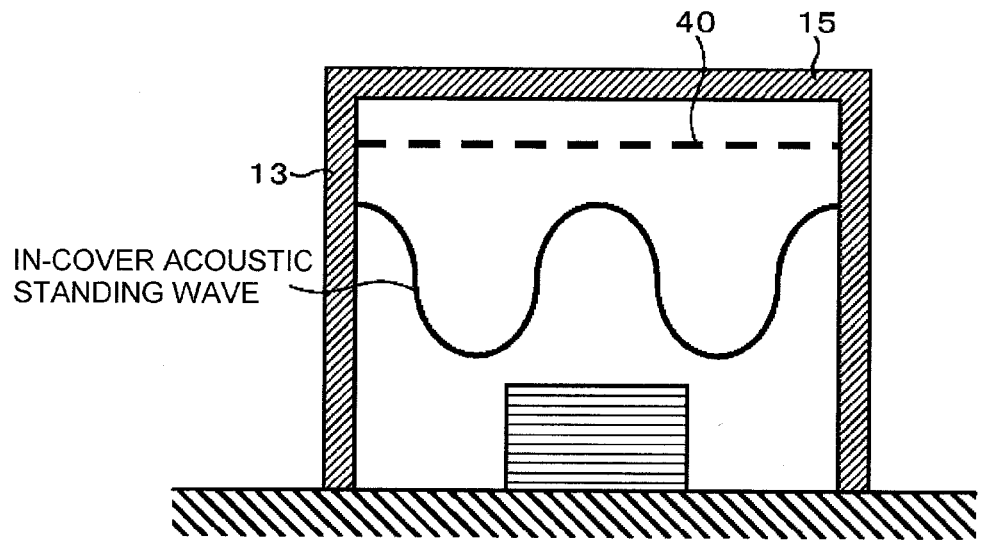
FIG. 7 is a diagram showing Embodiment 1 of the present invention absorbing the sound of the acoustic standing wave shown in FIG. 6.

FIG. 7 is a diagram for explaining the embodiment of the present invention.

The device 20, on which sound insulation or vibration removal is intended to be performed, is surrounded with the sides 13 of the cover on four sides thereof, and the ceiling 15 of the cover is installed on the upper part of the sides 13 of the cover. Although the floor face 16 is not described in the example shown in FIG. 7, it is also possible to provide the floor face of the cover as shown in FIG. 1 if necessary. The space surrounded by these sides 13, the ceiling 15, and the floor or the floor face not shown, and containing the device 20 corresponds to the space from which the external vibration is removed. If no acoustic treatment is performed on the sides 13 of the cover, the side of the cover has a flat Structure in a macroscopic view, and in the case in which the space formed by the cover and the floor can be assumed to have a cuboid shape, there is generated the acoustic standing wave having the frequency expressed by the following formula.

Formula 1

$$f_n = \frac{c}{2}\sqrt{\left(\frac{n_x}{l_x}\right)^2 + \left(\frac{n_y}{l_y}\right)^2 + \left(\frac{n_z}{l_z}\right)^2} \quad \text{(Formula 1)}$$

$f_n$: frequency of generated acoustic standing wave
c: sound speed in the air
$l_x$, $l_y$, $l_z$: representative dimensions in three directions
$n_x$, $n_y$, $n_z$: integer equal to or greater than 0

As expressed in Formula 1, the acoustic standing wave generated inside the cover has a specific frequency determined by the shape and the size of the inside of the space formed by the cover and the floor. As is understood from Formula 1, the flatter the inside of the cover is, and the more similar to a cuboid the space formed by the cover and the floor is, the more approximate to a single frequency the frequencies of the standing waves generated there become. Further, the vibrations with frequencies other than the frequency expressed by Formula 1 are automatically attenuated in the cover.

In the related art, from the viewpoint of reducing the occupation area of the device, the device 20 and the cover have been disposed closely to each other so as to reduce the area surrounded by the cover, and the structure of generating a standing wave having a specific frequency has not been adopted. Therefore, there has been no chance that the standing wave with a specific frequency is generated inside the cover, and further, there has been no chance to design the cover in order to control the frequency of the standing wave generated inside the cover. As a result, sounds throughout a wide frequency band have been generated inside the cover.

In the present invention, it is designed that by disposing the sides of the cover in parallel to each other, and adopting a flat structure without providing an acoustic treatment to the interior surfaces, the standing wave with the intended frequency is generated in the space surrounded by the cover. Further, the sound absorbing structure section 40 having an absorption frequency band including the frequency (the frequency of the generated acoustic standing wave) of the standing wave is installed on the lower part of the ceiling 15. Thus, the sound in the cover is effectively absorbed, and a significant soundproof effect can be obtained. As represented by those described in the following embodiment, the sound absorbing structure section 40 mentioned here denotes a member having a sound absorbing effect at the frequency of the generated acoustic standing wave, a part formed integrally with the ceiling board and having the sound absorbing effect at the frequency, or a unit attachable to the ceiling board and exerting the sound absorbing property at the frequency.

It has been known that it is preferable to take the space formed between the cover and the device as large as possible in order to effectively generate the acoustic standing wave. In reality, the size of the cover is determined considering the installation area of the device, the sound absorption frequency band of the sound absorbing structure section, and the size of the space formed between the cover and the device.

Further, if the sound absorption ratio of the sound absorbing structure section 40 has a local maximum value at a specific frequency, the sound can more effectively be insulated by designing the sound absorbing structure section 40 so that the frequency at the local maximum value and the frequency of the generated acoustic standing wave coincide with each other. It should be noted that although it is preferable that the frequency at the local maximum value and the frequency of the generated acoustic standing wave are equal to each other, even if the frequencies are not completely equal to each other, the advantage of the present invention is sufficiently obtained providing the sound absorption ratio of no lower than 70. % of that at the local maximum value is provided at the frequency of the generated acoustic standing wave. Therefore, the frequency band having the sound absorption ratio no lower than 70% of that at the local maximum value will hereinafter be referred to as the frequency band adjacent to the local maximum value.

Although the details of the sound absorbing structure section 40 to be installed on the ceiling 15 of the cover shown in FIG. 7 will hereinafter be explained, any structure can be adopted as the detailed structure of the sound absorbing structure section 40 providing the structure is effective for the sound absorption at the specific frequency described above, and has a dusting property so low as to be used in a clean room as described on and after Embodiment 2.

The structure of the acoustic resonator 41, which can be used as the sound absorbing structure section 40, will be explained in FIG. 8. The acoustic resonator 41 has a baffle section 41b having a plurality of hole sections (throat sections 41a) provided to the interior surface of the cover and hollow sections 41d communicated to the throat sections, and connecting each of the throat sections 41a, and a baffle section support member 41c for supporting the baffle sections 41b so as to be connected to the ceiling 15 of the cover. It should be noted that those having no dusting property need to be used as the members constituting the acoustic resonator 41 taking the use in a clean room into consideration.

The throat sections are disposed in the space between the interior surface 17 and the exterior surface 18 so that the interior surface of the cover becomes flat, but can also be formed so as to protrude from the interior surface 17 to form protruding sections in some cases. It should be noted that the flatter the interior surface 17 is, the more approximate to a single frequency, the frequencies of the generated acoustic standing waves become, and more efficiently the sound can be absorbed by the sound absorbing structure section of the present invention.

It has been known that the sound absorption ratio of such a structure takes the maximum value at the frequency expressed by Formula 2.

Formula 2

$$f_n = \frac{c}{2\pi}\sqrt{\frac{s}{V(l+0.8d)}} \quad \text{(Formula 2)}$$

$f_n$: sound absorption-specialized frequency
c: sound speed in the air
s: cross-sectional area of the opening section
V: capacity of the hollow section
l: length of the throat section
d: opening diameter By designing the dimensional data of each of the regions, namely the cross-sectional area s of the opening section, the capacity V of the hollow section, the length l of the throat section, and the opening diameter d so that the sound absorption-specialized frequency coincide with the frequency of the generated acoustic standing wave, such a significant soundproof effect as described above can be obtained. Each of the values of the parameters such as the cross-sectional area s of a mouth section, the capacity V of the hollow section, the length l of the throat section, and the opening diameter d can be varied on the ground of the design, and are sufficiently designed so that the sound absorption-specialized frequency determined by Formula 2 using each of the parameters efficiently absorbs the frequency of the generated acoustic standing wave. Specifically, the sound absorption-specialized frequency is designed to be equal or sufficiently approximate to the frequency of the generated acoustic standing wave. On this occasion, it is preferable to adjust the parameters described above so that the sound absorption ratio of the sound absorbing structure section at the frequency of the generated acoustic standing wave is equal to or higher than 0.7. It should be noted that the sound absorption ratio α is generally expressed by 1−((reflected wave)/(incident wave)).

Embodiment 2

Then, another example of the sound absorbing structure section 40 installed below the ceiling 15 of the cover in FIG. 7 will be explained.

Figure 9:
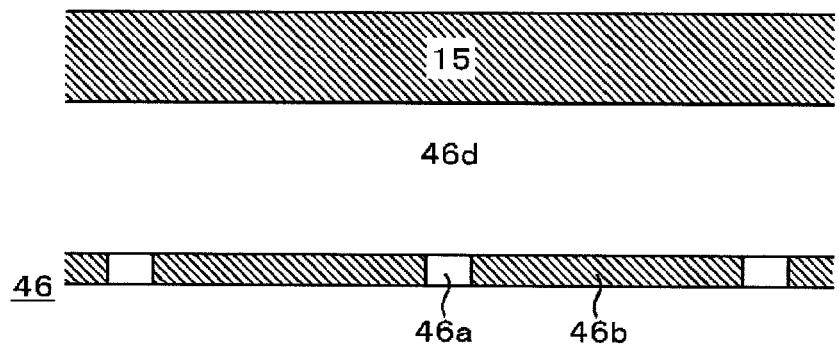
FIG. 9 is a diagram showing another specific example related to the sound absorbing structure section of the embodiment shown in FIG. 7.

In the present embodiment, as shown in FIG. 9, a perforated board 46 having a plurality of holes is disposed below the ceiling 15 of the cover so as to form a hollow section 46d in a space between the perforated board 46 and the ceiling 15. Although the mounting portion of the perforated board 46 is omitted in FIG. 9, the perforated board 46 can integrally be formed together with the ceiling 15 as a member having the hollow section 46d inside, or can be formed separately from the ceiling and fixed to the sidewalls. Further, it is also possible for the perforated board 46 to be attached to the ceiling via support members as described later. It should be noted that in view of the use in a clean room, it is necessary to use the material with a low dusting property for the perforated board 46 and the mounting portion. The design dimensions in this case are the hole diameter and aperture ratio of the opening sections, the plate thickness, and the thickness of a back air layer, and the frequency at which the sound absorption ratio takes the local maximum value is expressed by the following formula using these design dimensions. By designing the dimensional data of each of the regions so as to make the sound absorption-specialized frequency coincide with the frequency of the generated acoustic standing wave expressed by Formula 1, such a significant soundproof effect as described above can be obtained.

Formula 3

$$f_n = \frac{c}{2\pi}\sqrt{\frac{P}{L(l+0.8d)}}$$ (Formula 3)

$f_n$: sound absorption-specialized frequency
c: sound speed in the air
P: aperture ratio
L: thickness of the back air layer
l: plate thickness
d: opening diameter By using the sound absorbing structure section according to the present embodiment, a sound absorption-specialized frequency can be adjusted with the aperture ratio and the plate thickness of the perforated board 46, and therefore, it becomes possible to easily perform the design.

Figure 8:
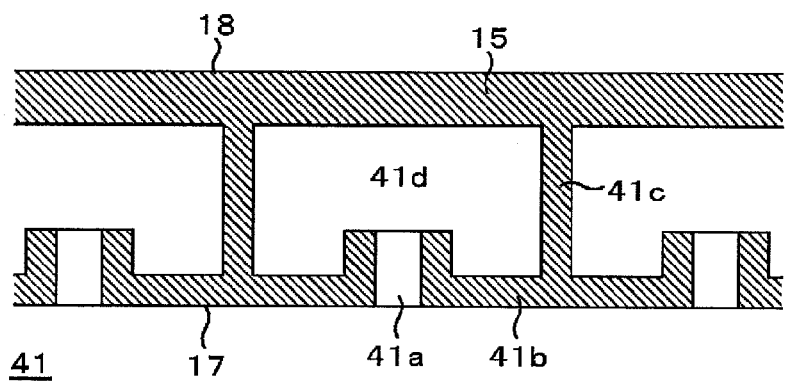
FIG. 8 is a detailed diagram related to a sound absorbing structure section of the embodiment shown in FIG. 7.
Figure 10:
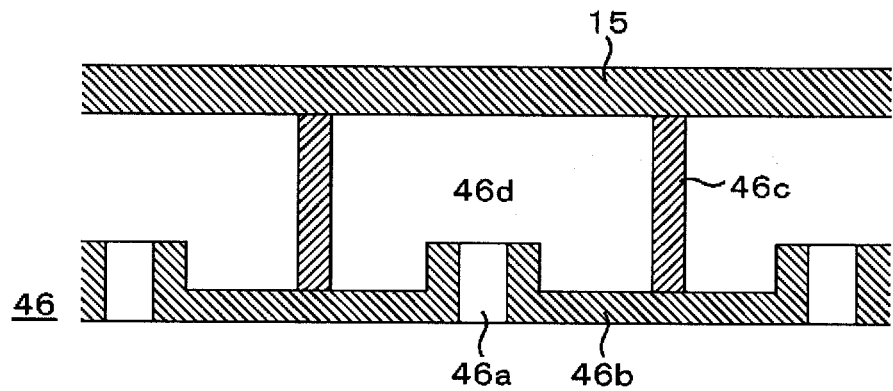
FIG. 10 is a diagram for explaining Embodiment 2 of the present invention.

FIG. 10 shows a modified example of the sound absorbing structure using the perforated board 46 shown in FIGS. 8 and 9. Although the sound absorbing structure section is formed integrally in FIGS. 8 and 9, the perforated board 46 is attached to the ceiling 15 using the support members 46c in FIG. 10. Further, although the frequency at which the sound absorption ratio takes the local maximum value can be controlled by the plate thickness in the case of the perforated board sound absorbing structure shown in FIG. 9, it is also possible to provide a throat sections to the opening section 46a as shown in FIG. 10, and to control the frequency by the length of the throat sections. By adopting this configuration, it is possible to set the local maximum frequency of the sound absorption ratio while thinning the plate thickness and in the low frequency band. Further, since it is not required to be formed integrally, it becomes possible to configure the sound absorbing structure section at low cost.

Embodiment 3

Then, still another example of the sound absorbing structure section 40 installed below the ceiling 15 of the cover in FIG. 7 will be explained.

Figure 11:
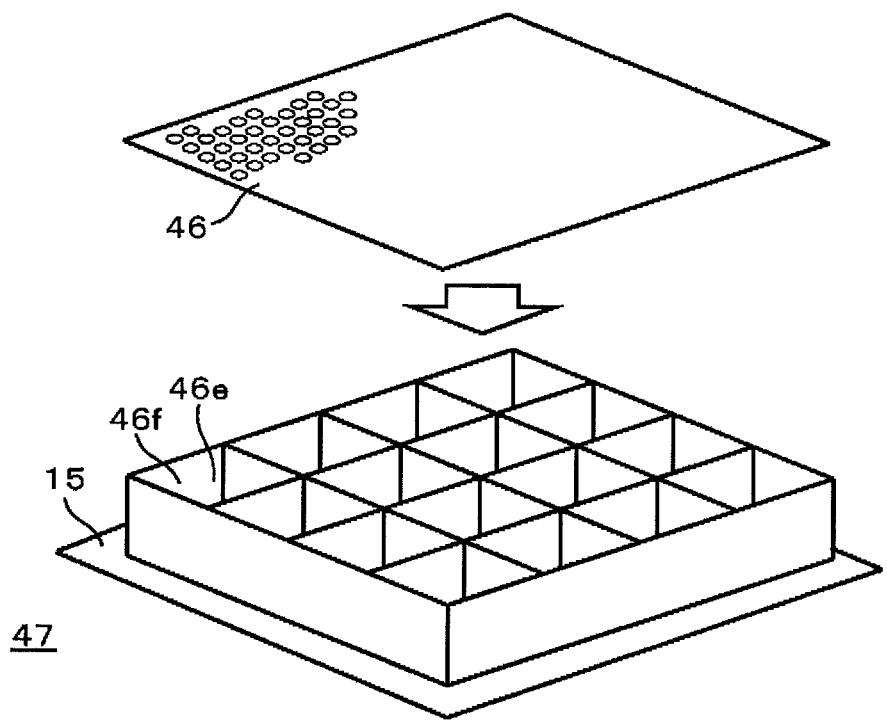
FIG. 11 is a diagram for explaining Embodiment 3 of the present invention.

As shown in FIG. 11, partition walls 46f are formed on the inside surface of the ceiling 15, namely the surface on the side facing the device 20, to thereby form a plurality of cells 46e. The perforated board 46 having a plurality of holes is mounted on the lower surfaces of the cells, namely the surfaces on the side facing the device 20, and a perforated board sound absorbing unit 47 is formed by combining these components. The plurality of cells 46e corresponds to the hollow section of the sound absorbing section described above, and exerts the sound absorption effect. Similarly to the embodiments described above, those having a low dusting property need to be used as the members constituting the perforated board sound absorbing unit 47, taking the use in a clean room into consideration.

Figure 12:
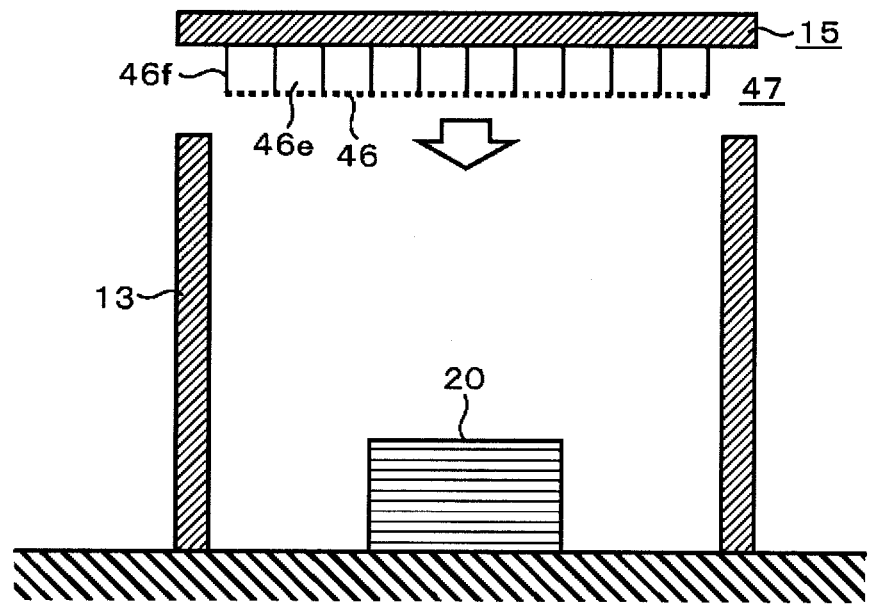
FIG. 12 is a diagram for explaining Embodiment 3 of the present invention.

The perforated board sound absorbing unit 47 integrated with the ceiling 15 is installed as the ceiling part of the soundproof cover so that the perforated board 46 is located inside in such a manner as shown in FIG. 12.

In such a sound absorbing structure section, the number, the capacity, the depth of the cells 46e, the plate thickness of the perforated board 46, the aperture ratio and the aperture diameter of the holes provided to the perforated board 46, and so on would be the parameters for determining the sound absorption-specialized frequency.

By adopting the cell structure as described above, the rigidity of the perforated board 46 can be kept. If the perforated board 46 vibrates together with the acoustic wave, the relative movement between the perforated board and the air in the hole sections is reduced to thereby degrade the sound absorption effect. However, by reducing the vibration of the perforated board due to the cell structure of the present embodiment, the degradation of the sound absorption effect can be prevented.

Figure 13:
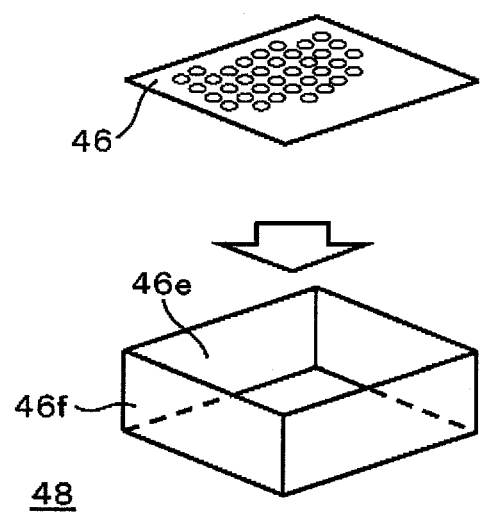
FIG. 13 is a diagram for explaining Embodiment 3 of the present invention.
Figure 14:
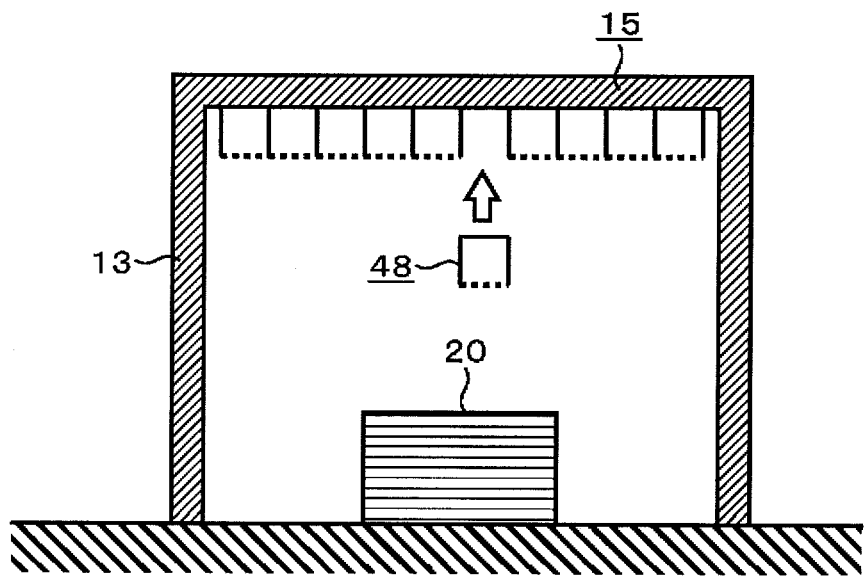
FIG. 14 is a diagram for explaining Embodiment 3 of the present invention.

The perforated board sound absorbing unit 47 shown in FIG. 11 can also be constituted by other methods, and some examples will be explained using FIGS. 13 and 14. FIG. 13 shows what (hereinafter referred to as a perforated board sound absorbing module 48) is obtained by carving out a part corresponding to a cell of the perforated board sound absorbing unit shown in FIG. 11. It is also possible to manufacture a number of such perforated board sound absorbing modules 48, and then install them on the inside of the ceiling of the soundproof cover so as to locate the perforated board 46 portions inside in such a manner as shown in FIG. 14.

By independently manufacturing each of the cells and then finally installing the cells on the ceiling 15 as described above, even if the size of the exterior cover is different between the types of the device or the models, or a design change is performed on the shape of the ceiling, it is possible to flexibly respond to the design change since it is only required to change the number of the perforated board sound absorbing modules 48 to be installed.

Embodiment 4

Figure 15:
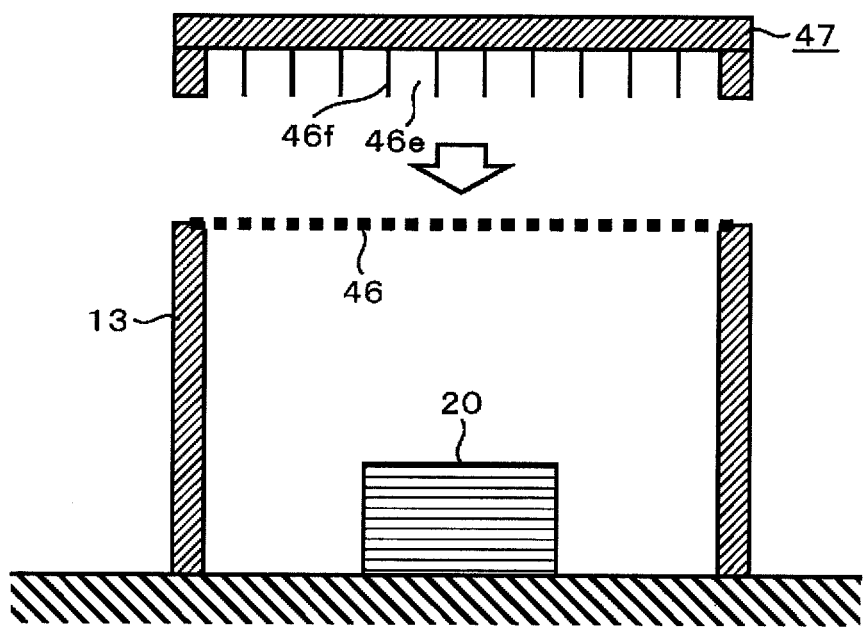
FIG. 15 is a diagram for explaining Embodiment 4 of the present invention.

Then, another attaching method of the sound absorbing structure section will be explained using FIG. 15. In FIG. 15, the perforated board 46 is installed on the upper part of the sides 13 as a member substituting for the ceiling to thereby form the cuboid space surrounding the device 20, and then a sound absorbing unit, which is designed to form hollow sections when being attached, and is integrated with the ceiling 15, is further installed thereon.

Specifically, the perforated board sound absorbing unit 47 having a plurality of cell structures partitioned by the partition walls 46f is installed above the perforated board so that the opening section of each of the cells 46e faces to the perforated board side.

Further, although in FIG. 15, the description is presented with the example of the perforated board sound absorbing unit 47, it is obviously possible to attach such an acoustic resonator 41 as shown in FIG. 8 instead of the perforated board sound absorbing unit having the cell structure, or to install the ceiling 15 from above with a gap corresponding to the thickness of the air layer fulfilling Formula 3 disposed above the perforated board 46 as shown in FIG. 9. Further, it is also possible to attach the ceiling 15 integrated with the support members 46c on the perforated board 46 as shown in FIG. 10.

According to such a configuration, when modifying the existing soundproof cover to the structure exerting the effect of the present invention, the modification can be performed with extreme ease and simplicity.

Embodiment 5

Then, another configuration of the sound absorbing structure section 40 will be explained using FIG. 16.

Figure 16:
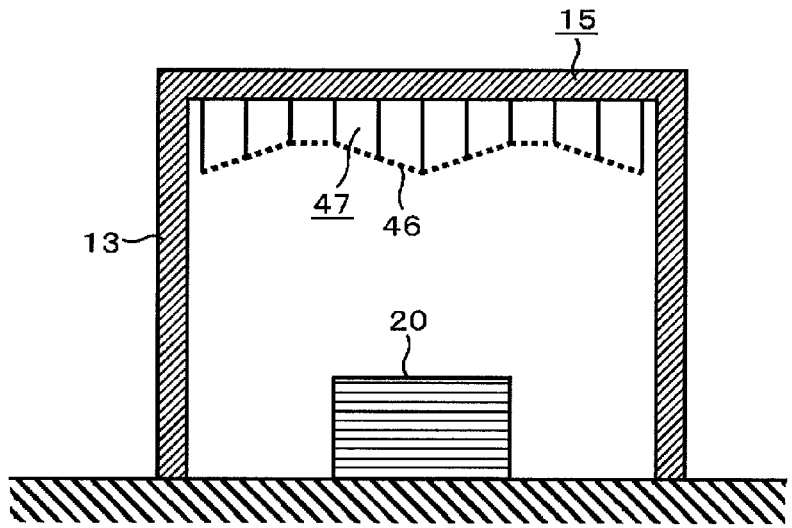
FIG. 16 is a diagram for explaining Embodiment 5 of the present invention.

In the perforated board sound absorbing unit shown in FIG. 16, the sizes of the respective cells are not uniform, but have a distribution. Specifically, it is possible to vary the capacity by varying the area of the base of the cell due to the configuration of the partition walls 46f, or to vary the capacity by providing a curved surface shape to the perforated board 46 to thereby vary the height of the cell as shown in FIG. 16.

Although the interior surface of the ceiling fails to be flat since the perforated board 46 is curved in FIG. 16, the interior surfaces of the sides of the cover are flat. Since the acoustic standing wave generated between the sidewalls hardly depends on the ceiling, by designing the size of the cover in advance of the installation thereof, it is possible to generate the acoustic standing wave with the intended specific frequency between the sidewalls. By making the frequency band of the acoustic standing wave and the sound absorption frequency band of the sound absorbing structure section coincide with each other, an effective soundproof cover can be configured.

By adopting the structure of providing a distribution to the capacities of the hollow sections as described above, the frequency band having the sound absorption effect is broadened, and therefore, it is possible to obtain a strong sound absorption effect in a broader frequency band while keeping the local maximum value at a specific frequency.

Further, substantially the same effect can be obtained also by varying the capacity of each of the hollow sections 41d with respect to the acoustic resonator shown in FIG. 8.

Embodiment 6

In the present embodiment, an embodiment using the soundproof cover described above as an exterior cover of a charged particle radiation device will be explained. Here, the charged particle radiation device mainly denotes an inspection device, an observation device, and a measurement device for semiconductors or liquid crystal substrates, an electron microscope, a focused ion beam system, and so on. Further, the present invention can be applied to any device besides the charged particle radiation device providing fine fabrication or highly accurate observation is required for the device.

Since these charged particle radiation devices perform fabrication or observation at a high magnification of several millions of times, if an external vibration exists, a vibration disorder such as a wobble of an image is incurred. Therefore, it is necessary to prevent the external vibration and the external noise having a variety of frequencies from being transmitted to the inside of the housing. However, if typical soundproof walls are used, a large-scale device is required to perform absorption in a broad frequency band, which incurs increase in weight, installation area, and cost.

Further, these charged particle radiation devices are used mainly in a clean room. As the sound absorbing material used for a typical soundproof wall, there are used materials having a dusting property such as glass wool or urethane material, and it is not allowed to bring the sound absorbing material to the clean room unless a measure such as covering the sound absorbing material with a dust-proof material is taken so as to prevent the dust from flying in all directions. Further, even if the sound absorbing material is covered with the dust-proof material, there exists a possibility that the dust-proof material is deteriorated with time to cause dusting.

Since the present invention is related to the cover, which can obtain a soundproof effect without using the material having a dusting property, by using the cover as the exterior covers of these charged particle radiation devices, the problems described above can be solved.

Figure 17:
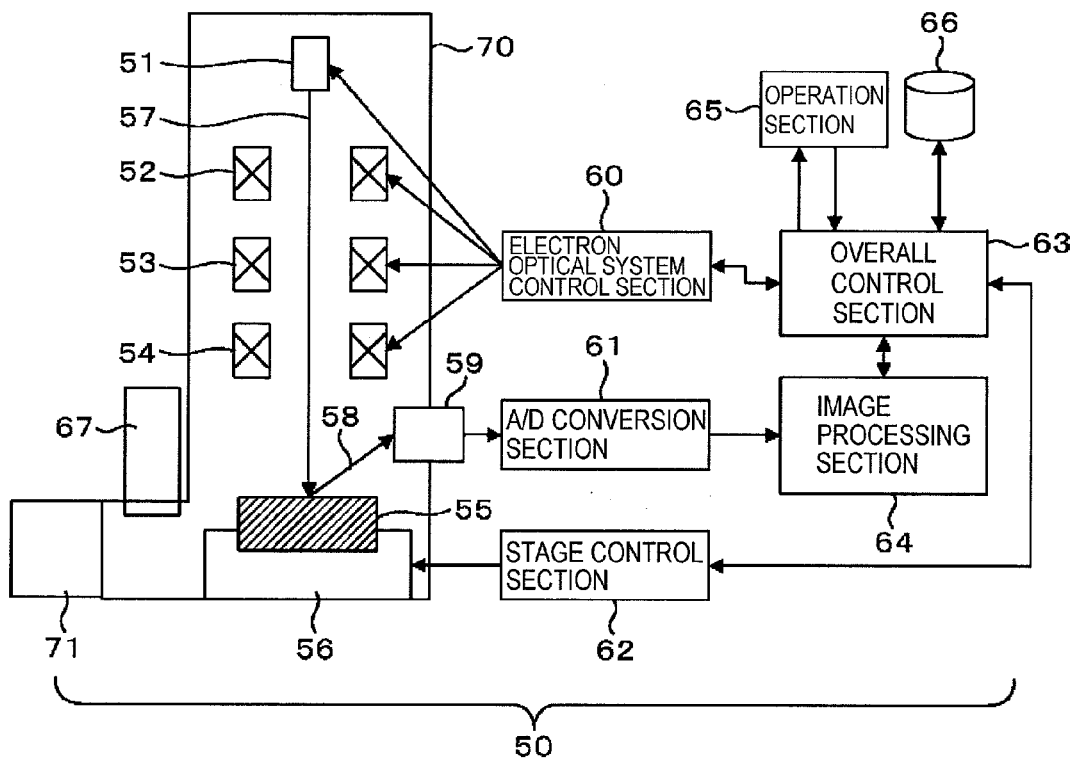
FIG. 17 is a schematic diagram for explaining an example of a charged particle radiation device.

FIG. 17 is a schematic diagram showing an overall configuration of a SEM type defect observation device as an example of the charged particle radiation device. The SEM type defect observation device shown in FIG. 17 is composed of an electron optical system formed of an electron gun 51, a lens 52, a scanning deflector 53, an objective lens 54, a sample 55, a secondary particle detector 59, and so on, a stage 56 for translating a sample stage for holding the sample to be an observation object in an X-Y plane, an electron optical system control section 60 for controlling the various optical elements included in the electron optical system, an A/D conversion section 61 for quantizing the output signal of the secondary particle detector 59, a stage control section 62 for controlling the stage 56, an overall control section 63, image processing section 64, an operation section 65 formed of a pointing device such as a display, a keyboard, or a mouse, optical microscope 67, and so on. Further, the electron optical system, the electron optical system control section 60, the A/D conversion section 61, the stage 56, and the stage control section 62 constitute a scanning electron microscope, which is imaging means of an SEM image.

Firstly, the sample 55 is mounted on the sample stage by a loader (not shown) for conveying the sample, and is then conveyed from a sample preparation chamber 71 into an electron microscope 70.

A primary electron beam 57 emitted from the electron gun 51 is focused by the lens 52, then deflected by the scanning deflector 53, then focused by the objective lens 54, and is then applied to the sample 55. The secondary particles 58 such as the secondary electrons or the reflection electrons are generated in accordance with the shape and the material of the sample from the sample 55 irradiated with the primary electron beam 57. The secondary particles 58 thus generated are detected by the secondary particle detector 59, and are then converted in the A/D conversion section 61 into a digital signal. The output signal of the secondary particle detector converted into the digital signal may be referred to as an image signal. The output signal of the A/D converter 61 is input to the image processing section 64, and forms the SEM image. The image processing section 64 performs a variety of image processing such as the defect detection and the defect analysis using the image comparison.

The control of the optical elements in the electron optical system such as the lens 52, the scanning deflector 53, the objective lens 54, and so on is performed by the electron optical system control section 60. The position control of the sample is performed by the stage 56, which is controlled by the stage control section 62. The overall control section 63 is a control section for integrally controlling the entire SEM type defect observation device, interprets the input from the operation section 65 and a storage section 66, controls the electron optical system control section 60, the stage control section 62, the image processing section 64, and so on, and then outputs the processing result to a display section (not shown) included in the operation section 65, and the storage section 66 if necessary.

A part or the whole of the overall control section 63 and the image processing section 64 explained hereinabove can be realized by either of a form of hardware and a form of software. In the case of configuring it with hardware, it can be realized by integrating a plurality of computing units for performing the necessary processing on a wiring board, a single semiconductor chip, or inside a package. In the case of configuring it with software, it can be realized by making a high-speed general-purpose CPU execute the program for performing the process formed of software such as the image processing.

Figure 18:
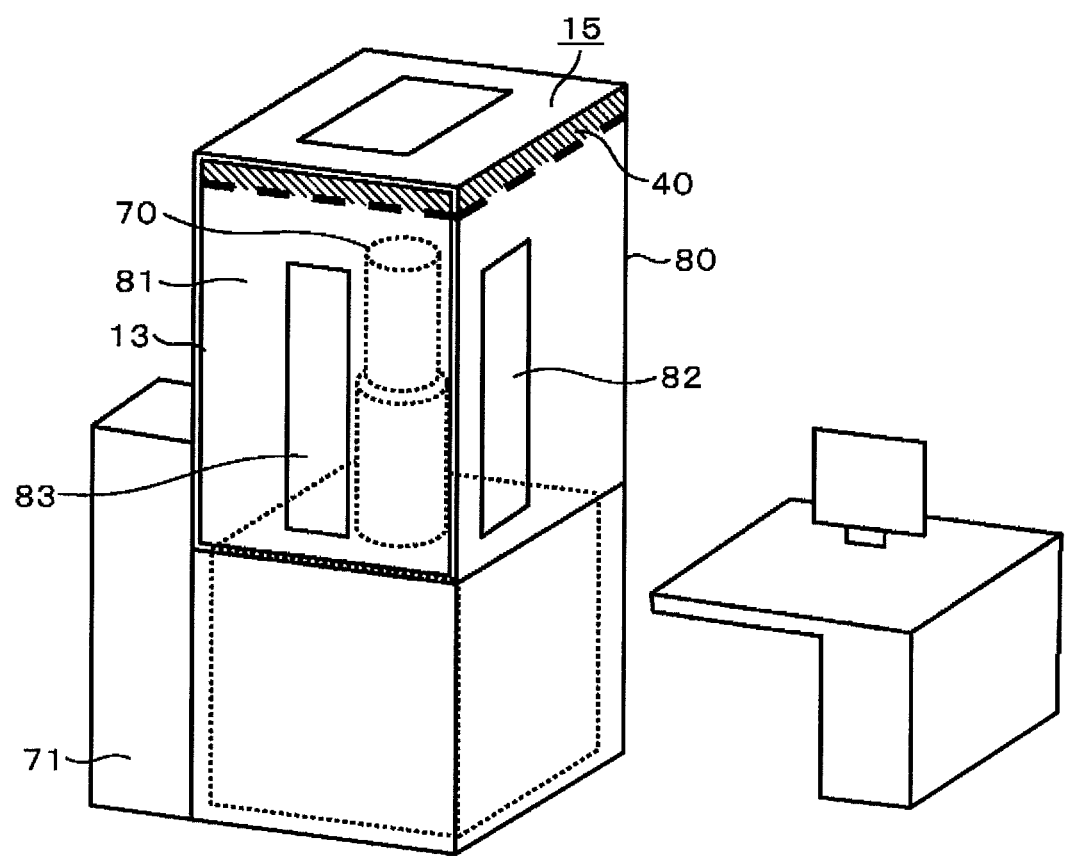
FIG. 18 is an example of applying the soundproof cover according to the present invention to the charged particle radiation device.

FIG. 18 is an appearance diagram showing an example of the charged particle radiation device according to the present invention. On the periphery of the electron microscope 70, there is disposed an exterior cover 80 so as to surround the whole of the electron microscope 70. The exterior cover 80 is formed of a material such as a steel plate or resin. Further, the exterior cover 80 is attached with an operation door 81 and an operation window 82 for operation, which are openable and closable. The operation window 82 is formed of a material such as a steel plate, resin, or glass. Further, an observation window 83 for observing the inside is attached. The observation window 83 is formed of a material such as glass or resin so that the inside can be monitored. The operation door 81, the operation window 82, the observation window 83 are each a part of the exterior cover 80, and these are collectively referred to as the exterior cover 80. It should be noted that the observation window 83 can also be formed of a metal material providing an openable and closable type is adopted.

In FIG. 18, the ceiling 15 is provided with the sound absorbing structure section 40. As the sound absorbing structure section 40, any one of the structures of the respective embodiments described above can be adopted. Since no acoustic treatment is provided to the sides 13, and the interior surfaces thereof are provided with a flat structure, the standing wave is generated in the exterior cover. The sound absorbing structure section 40 installed on the ceiling of the cover is designed in such a manner as in the embodiments described above so that the absorption band has the local maximum value or becomes the vicinity of the local maximum value at the frequency of the standing wave.

According to the configuration described above, the exterior caver of the charged particle radiation device can, be configured as a soundproof cover, and thus the problems such as the wobble of the image due to the external vibration can be suppressed.

It should be noted that although the drawing including only the electron microscope in the exterior cover is shown in FIG. 18, it is obviously possible to include the sample preparation chamber 71 inside the exterior cover. Further, as described above, since the overall control section 63, the image processing section 64, and so on are partially or entirely formed of hardware, the part formed of the hardware can be surrounded by the same exterior housing as that of the electron microscope, or can be treated as a separate housing surrounded by a separate exterior plate from the electron microscope. It should be noted that since the device for which the sound insulation or the vibration removal is required is the electron microscope, it is conceivable that the loader for conveying the sample, the control board having a cooling fan, and so on are preferably disposed in a separate housing, or a partition wall is preferably disposed in the housing so that the vibration source is not included in the same housing.

By using the soundproof cover described above as the exterior cover for surrounding the electron microscope as shown in FIG. 18, the vibration caused by the external air blow or noise can be reduced, and thus the wobble of the image can be suppressed.

| Description of Reference Numerals and Signs | |
|---|---|
| 10: | soundproof cover |
| 11: | side A |
| 12: | side B |
| 13: | side C |
| 14: | side D |
| 15: | ceiling |
| 16: | floor face |
| 17: | interior surface |
| 18: | exterior surface |
| 20: | device |
| 30: | sound insulating structure section |
| 31: | organic porous material |
| 40: | sound absorbing structure section |
| 41: | acoustic resonator |
| 41a: | throat section |
| 41b, 46b: | baffle section |
| 41c: | baffle section support member |
| 41d, 46d: | hollow section |
| 46: | perforated board |
| 46a: | opening section |
| 46c: | support member |
| 46e: | cell |
| 46f: | partition wall |
| 47: | perforated board sound absorbing unit |
| 48: | perforated board sound absorbing module |
| 50: | charged particle radiation device |
| 51: | electron gun |
| 52: | lens |
| 53: | scanning deflector |
| 54: | objective lens |
| 55: | sample |
| 56: | stage |
| 57: | primary electron beam |
| 58: | secondary particle |
| 59: | secondary particle detector |
| 60: | electron optical system control section |
| 61: | A/D conversion section |
| 62: | stage control section |
| 63: | overall control section |
| 64: | image processing section |
| 65: | operation section |

| | Description of Reference Numerals and Signs |
|---|---|
| 66: | storage device |
| 67: | optical microscope |
| 70: | electron microscope |
| 71: | sample preparation chamber |
| 80: | exterior cover |
| 81: | operation door |
| 82: | operation window |
| 83: | observation window |

The invention claimed is:

1. A charged particle radiation device, comprising:
a sample chamber, in which a sample stage adapted to mount a sample is installed;
a charged particle radiation irradiation section adapted to irradiate the sample with a charged particle radiation to observe and fabricate the sample;
sidewalls installed on a periphery of the sample chamber and the charged particle radiation irradiation section;
a ceiling board installed on a plane located in an upper part of the sidewalls; and
a sound absorbing structure section disposed below the ceiling board, and including a plurality of hole sections and a hollow section in communication with the hole sections;
wherein the sound absorbing structure section has an absorption band including a frequency band of a standing wave generated in a space surrounded by the sidewalls and the ceiling board;
wherein the hollow section is formed of a plurality of cells partitioned on a lower surface of the ceiling board with partition walls; and
wherein the plurality of hole sections is provided to a perforated board disposed on a lower surface of the plurality of cells.

2. The charged particle radiation device according to claim 1, wherein the frequency of the standing wave is included in one of a frequency taking a local maximum value of the absorption band of the sound absorbing structure section, and a frequency band adjacent to the local maximum value.

3. The charged particle radiation device according to claim 1, wherein a sound absorption ratio of the sound absorbing structure section at the frequency of the standing wave is one of equal to and higher than 0.7.

4. The charged particle radiation device according to claim 1, wherein the sound absorbing structure section is attached to the ceiling board with support members connected to the ceiling board.

5. The charged particle radiation device according to claim 1, wherein the cells can independently be attached one by one.

6. The charged particle radiation device according to claim 1, wherein the hollow section includes a plurality of cells different in capacity from each other.

7. The charged particle radiation device according to claim 1, further comprising:
a detector adapted to detect a secondary charged particle obtained by irradiating the sample with the charged particle radiation; and
an image processing section adapted to form an image from the detector.

8. A charged particle radiation device, comprising:
a sample chamber, in which a sample stage adapted to mount a sample is installed;
a charged particle radiation irradiation section adapted to observe and fabricate the sample; and
a cover adapted to surround the sample chamber and the charged particle radiation irradiation section;
wherein the cover includes:
sidewalls installed on a periphery of the sample stage and the charged particle radiation irradiation section,
a ceiling board installed on a plane located in an upper part of the sidewalls, and having a plurality of holes, and
a sound absorbing unit having a structure of forming a hollow section in communication with the plurality of holes in a case in which the sound absorbing unit is installed above the ceiling board, and
an absorption frequency band of the sound absorbing structure section formed of the sound absorbing unit includes a frequency of a standing wave generated inside the cover;
wherein the hollow section is formed of a plurality of cells partitioned on a lower surface of the ceiling board with partition walls; and
wherein the plurality of hole sections is provided to a perforated board disposed on a lower surface of the plurality of cells.

9. The charged particle radiation device according to claim 8, wherein the sound absorbing unit has cells constituted by partition walls.

10. The charged particle radiation device according to claim 8, wherein the frequency of the standing wave is included in one of a frequency taking a local maximum value of the absorption band of the sound absorbing structure section, and a frequency band adjacent to the local maximum value.

* * * * *